(12) United States Patent
Lee et al.

(10) Patent No.: US 11,903,312 B2
(45) Date of Patent: *Feb. 13, 2024

(54) HEAT CONVERSION APPARATUS

(71) Applicant: LG INNOTEK CO., LTD., Seoul (KR)

(72) Inventors: Un Hak Lee, Seoul (KR); Sang Hoon Bong, Seoul (KR); Young Kil Song, Seoul (KR); Yun Sang Song, Seoul (KR); Jung Ho Kim, Seoul (KR); Seong Jae Jeon, Seoul (KR); Young Sam Yoo, Seoul (KR); Sung Chul Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/534,866

(22) Filed: Nov. 24, 2021

(65) Prior Publication Data

US 2022/0093839 A1 Mar. 24, 2022

Related U.S. Application Data

(63) Continuation of application No. 16/615,516, filed as application No. PCT/KR2018/006480 on Jun. 7, 2018, now Pat. No. 11,205,746.

(30) Foreign Application Priority Data

Jun. 8, 2017 (KR) .................. 10-2017-0071493
Sep. 29, 2017 (KR) .................. 10-2017-0128154

(51) Int. Cl.
*H10N 10/13* (2023.01)
*H10N 10/17* (2023.01)
*H10N 10/82* (2023.01)

(52) U.S. Cl.
CPC ............. *H10N 10/13* (2023.02); *H10N 10/17* (2023.02); *H10N 10/82* (2023.02)

(58) Field of Classification Search
CPC .......... H10N 10/13; H10N 10/17; H10N 10/82
See application file for complete search history.

(56) References Cited

U.S. PATENT DOCUMENTS 7,523,607 B2 * 4/2009 Sullivan .................... F01N 3/18
60/320
2004/0145049 A1 7/2004 McKinnell et al.
(Continued)

FOREIGN PATENT DOCUMENTS

| JP | 2004-235639 | 8/2004 |
| JP | 2007-036178 | 2/2007 |

(Continued)

OTHER PUBLICATIONS

International Search Report dated Sep. 3, 2018 issued in Application No. PCT/KR2018/006480.
(Continued)

*Primary Examiner* — Tamir Ayad
(74) *Attorney, Agent, or Firm* — KED & ASSOCIATES, LLP

(57) ABSTRACT

A heat conversion apparatus according to one embodiment of the present invention comprises: a pipe which includes a first flat surface and a second flat surface disposed parallel to the first surface, and through which air having a lower temperature than entered air is discharged; a plurality of thermoelectric elements that have heat-absorbing surfaces disposed in external sides of the respective first and second surfaces; a plurality of printed circuit boards (PCBs) that are electrically connected to the plurality of thermoelectric elements; and coolant passing members that are disposed on heat-radiating surfaces of the plurality of thermoelectric elements, wherein an external floor surface of the coolant passing member includes a plurality of first external floor surfaces having a first height and a plurality of second external floor surfaces having a second height that is differ- (Continued)

ent from the first height, the plurality of first external floor surfaces are in contact with the heat-radiating surfaces of the plurality of thermoelectric elements, and the plurality of PCBs are disposed in the plurality of second external floor surfaces.

15 Claims, 14 Drawing Sheets

(56) References Cited

U.S. PATENT DOCUMENTS

| | | | |
|---|---|---|---|
| 2006/0289051 | A1 | 12/2006 | Niimi et al. |
| 2014/0182647 | A1 | 7/2014 | Gille et al. |
| 2014/0261606 | A1 | 9/2014 | Nies et al. |
| 2015/0303365 | A1* | 10/2015 | Tominaga ............. H10N 10/17 136/210 |
| 2015/0333244 | A1 | 11/2015 | Iriyama |

FOREIGN PATENT DOCUMENTS

| | | |
|---|---|---|
| JP | 2009-081287 | 4/2009 |
| JP | 2010-245265 | 10/2010 |
| JP | 2014-037796 | 2/2014 |
| JP | 2014-066236 | 4/2014 |
| JP | 2014-086454 | 5/2014 |
| JP | 2015-115590 | 6/2015 |
| KR | 10-2011-0022174 | 3/2011 |
| KR | 10-2011-0073101 | 6/2011 |
| KR | 10-1177266 | 8/2012 |

OTHER PUBLICATIONS

European Search Report dated Mar. 15, 2021 issued in Application No. 18812615.5.
Korean Office Action dated Mar. 26, 2021 issued in Application No. 10-2017-0071493.
Korean Office Action dated Dec. 17, 2021 issued in KR Application No. 10-2021-0161156.

* cited by examiner

[FIG. 1]
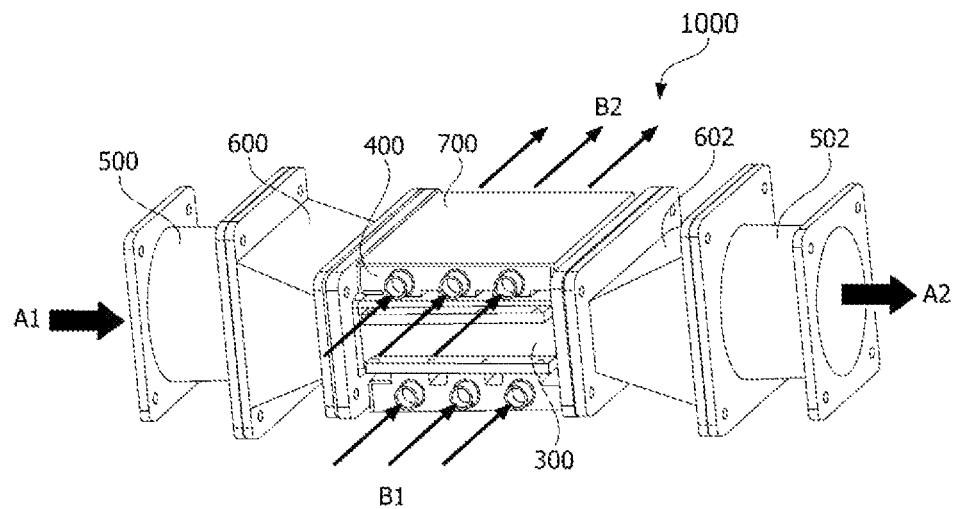
[FIG. 2]
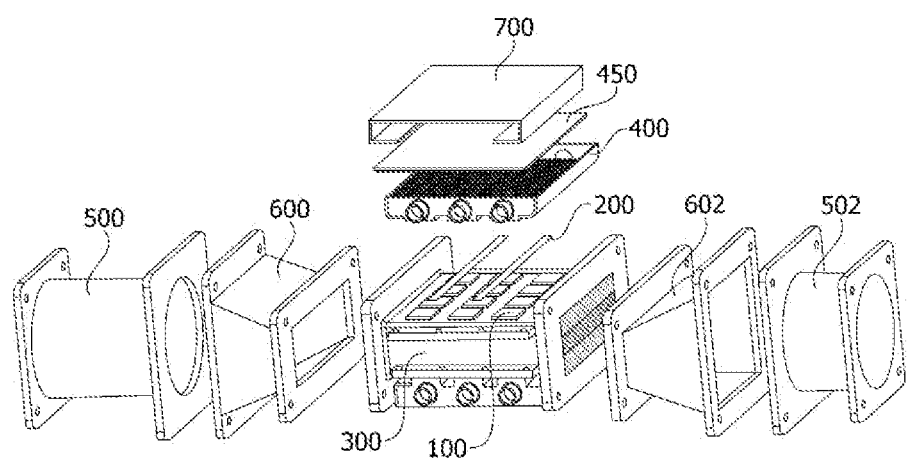

[FIG. 4]
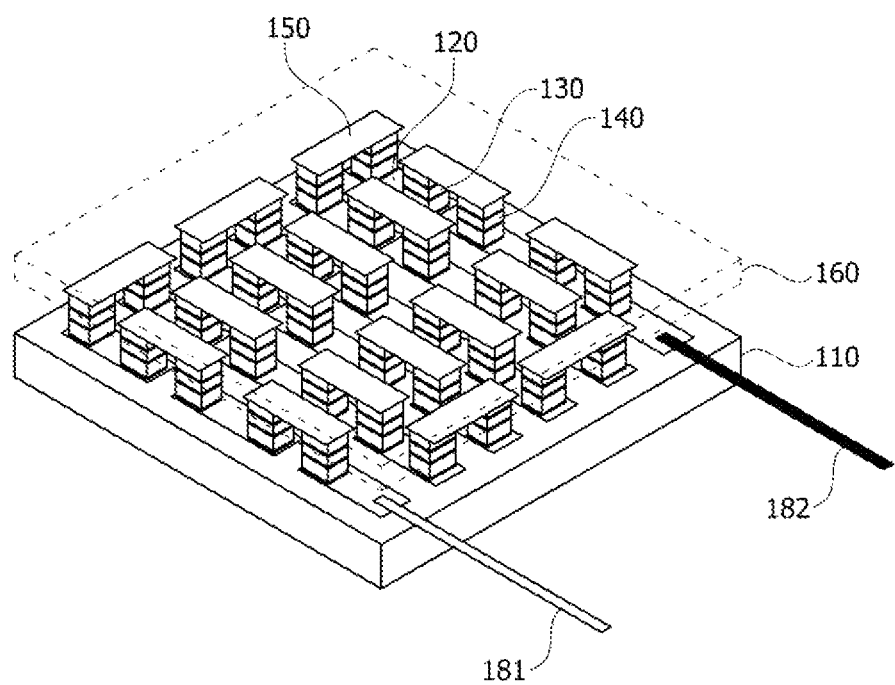

[FIG. 5]
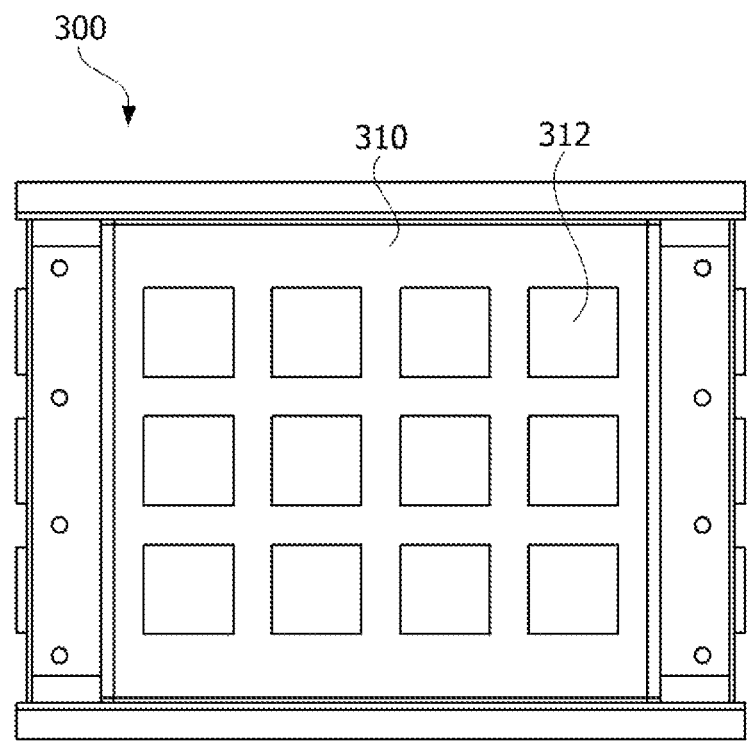
[FIG. 6]
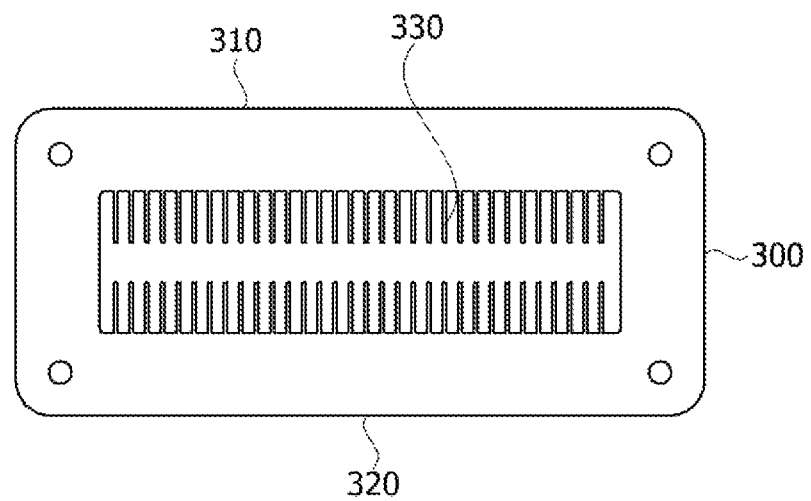

[FIG. 7]
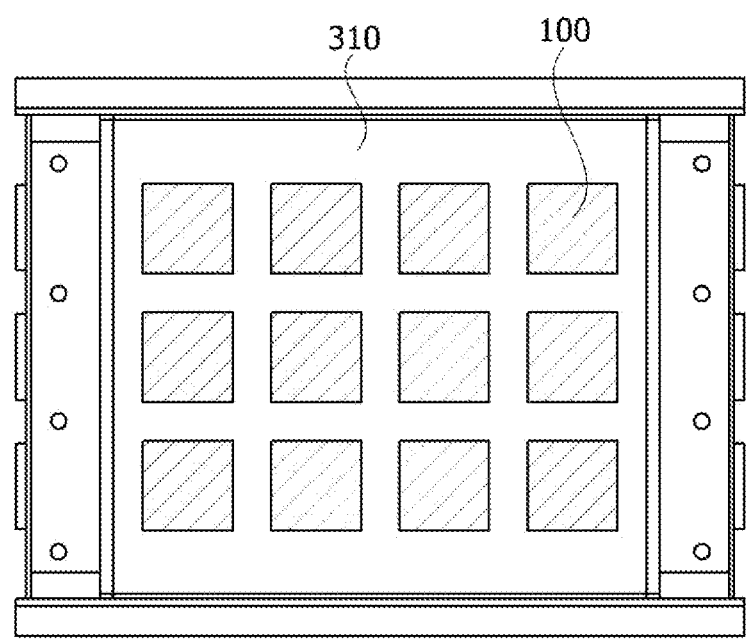

[FIG. 8]
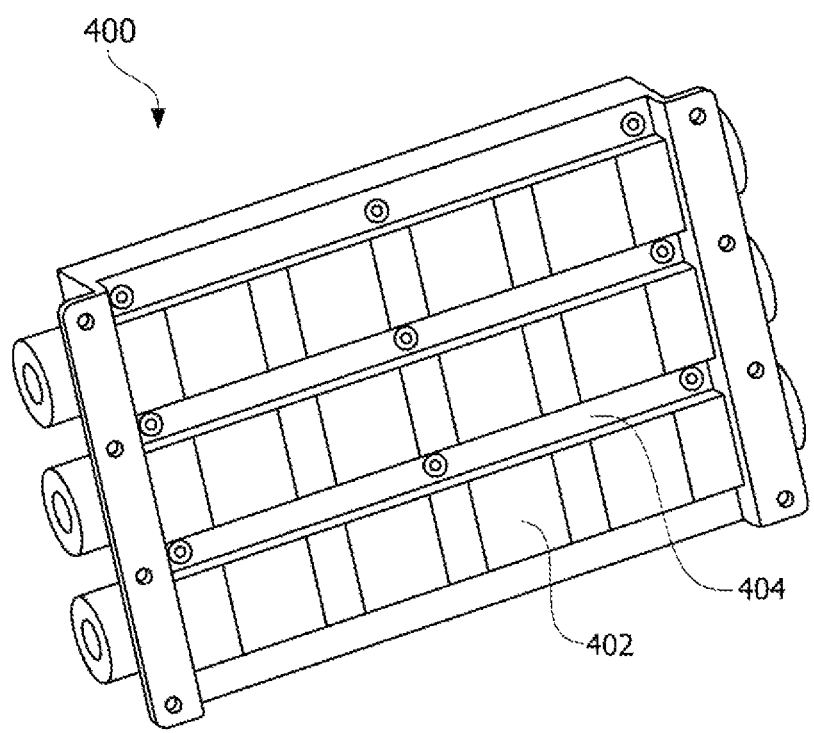

[FIG. 9]
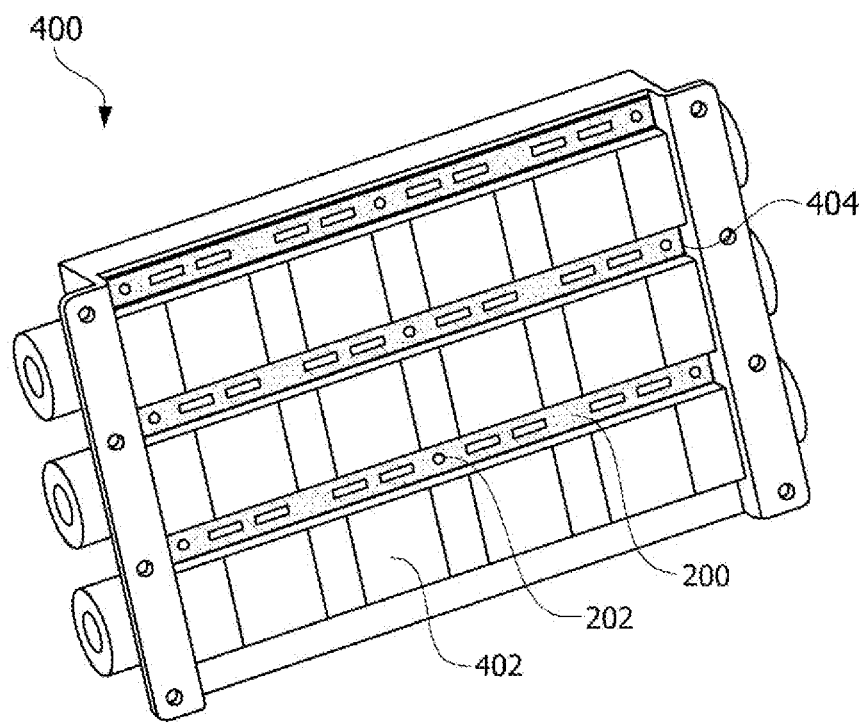

[FIG. 10]
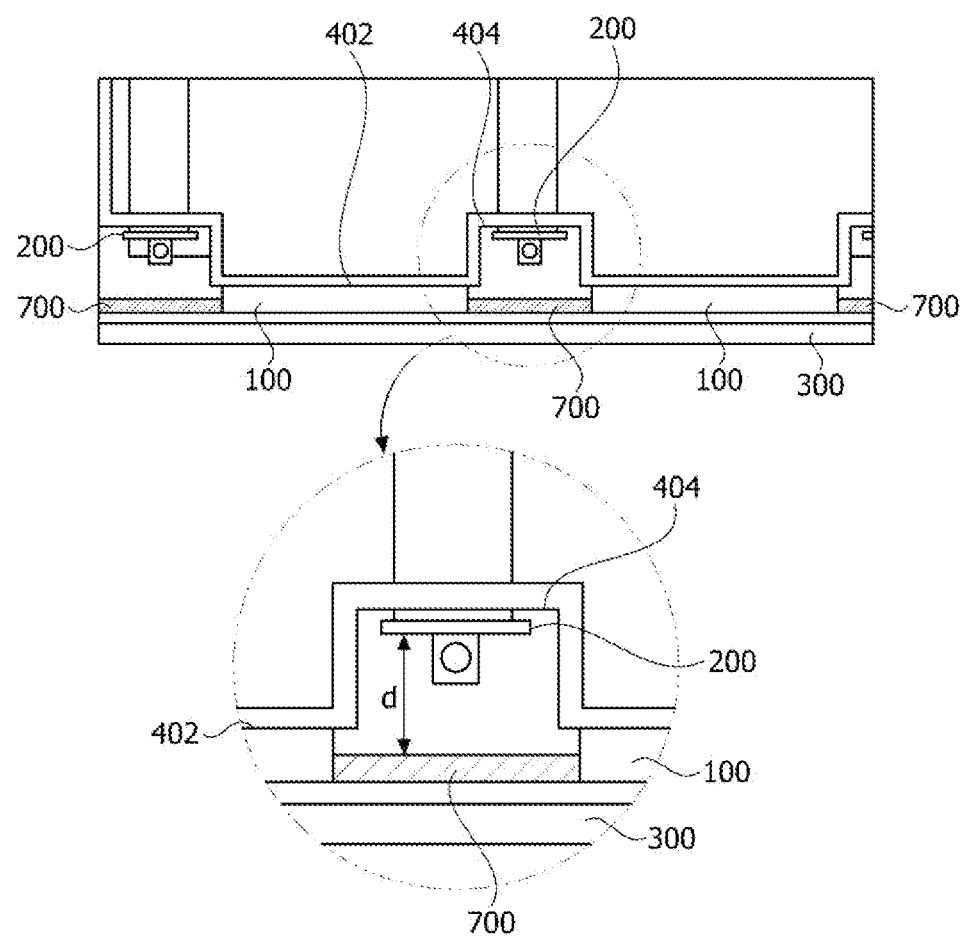

[FIG. 11]
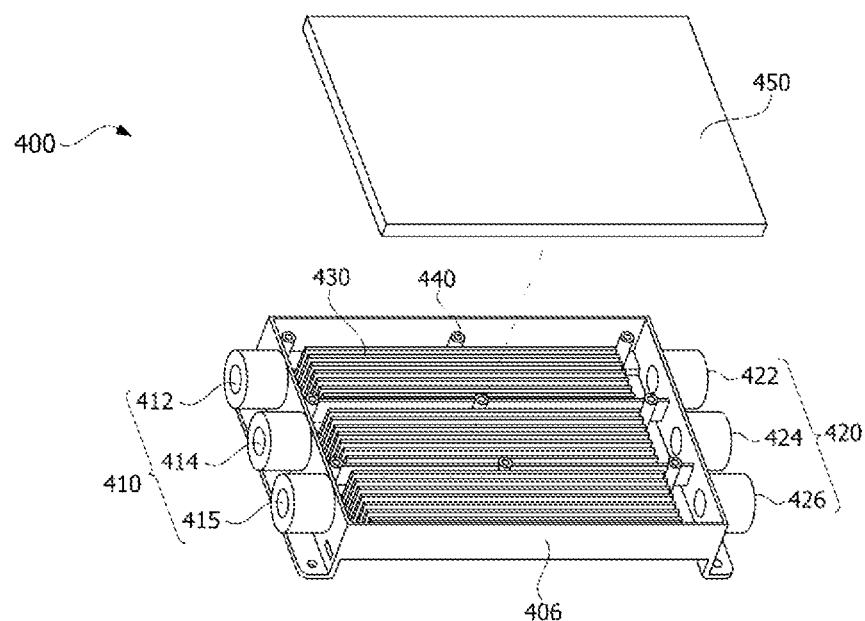
[FIG. 12]
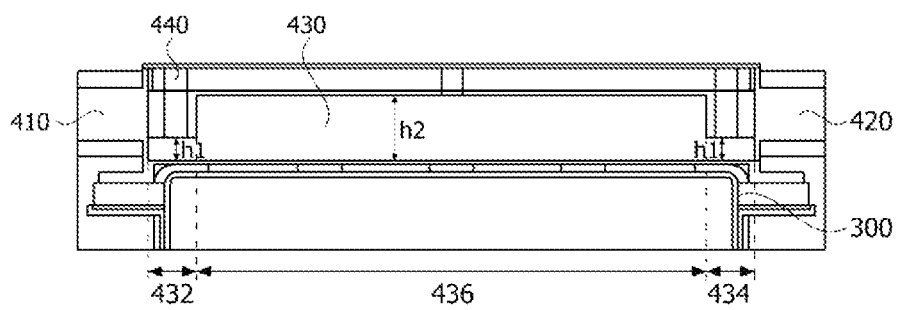

[FIG. 13]
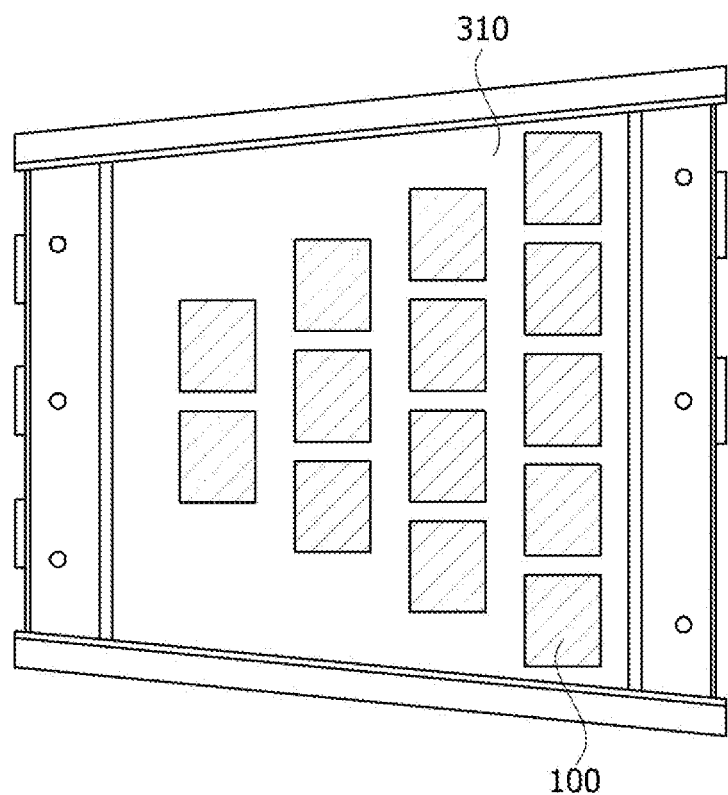

[FIG. 14]
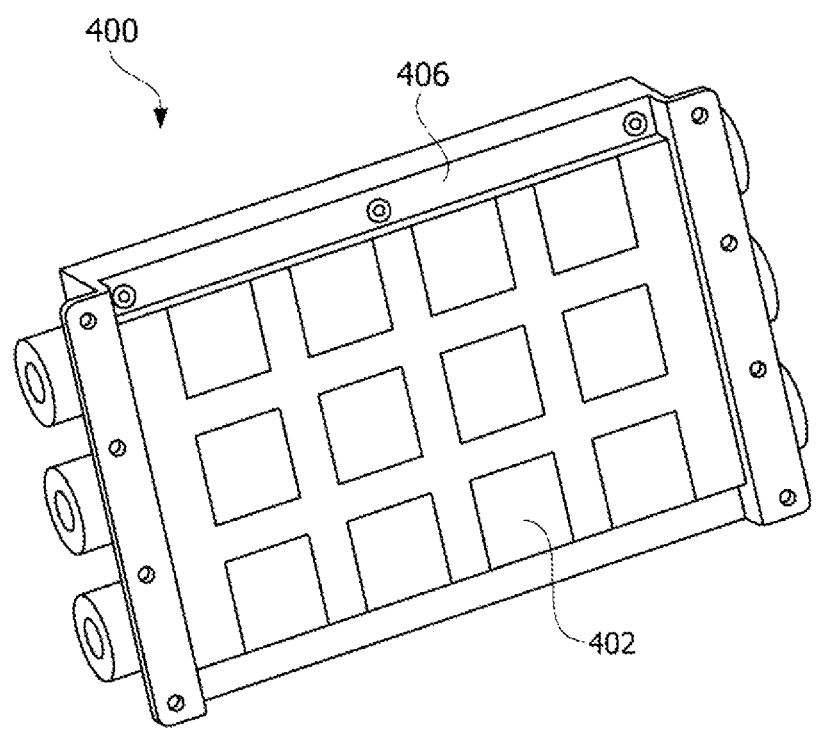

[FIG. 15]
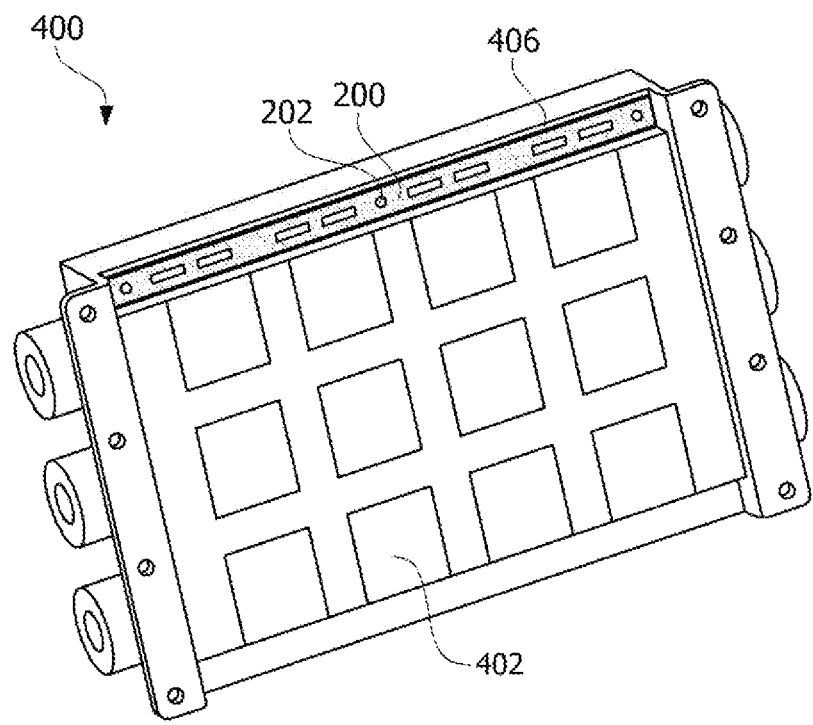
[FIG. 16]
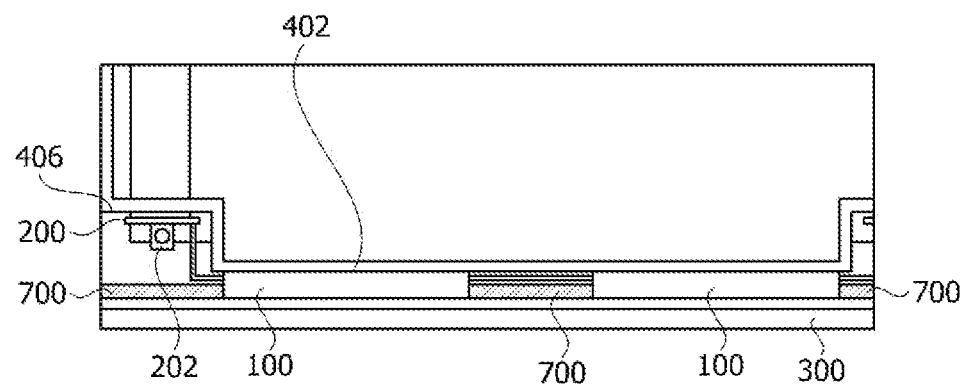

[FIG. 17]
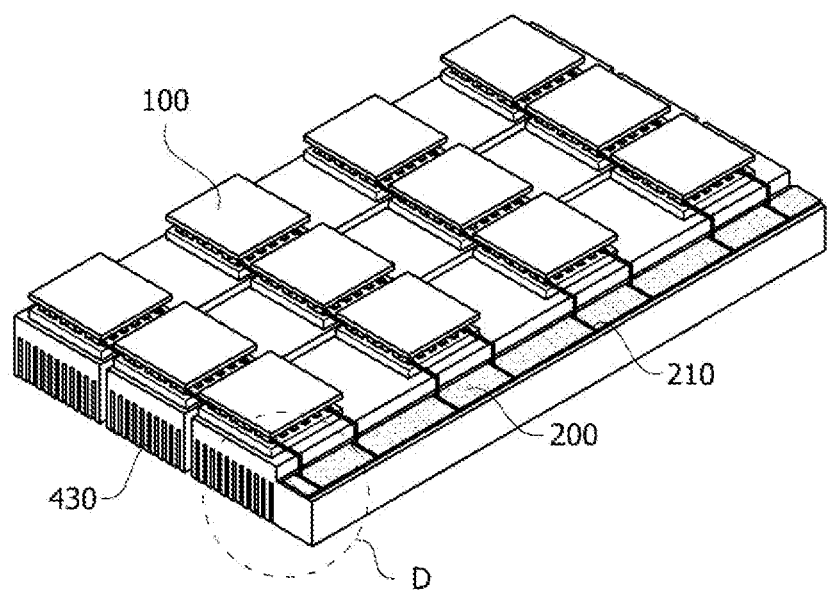

[FIG. 18]
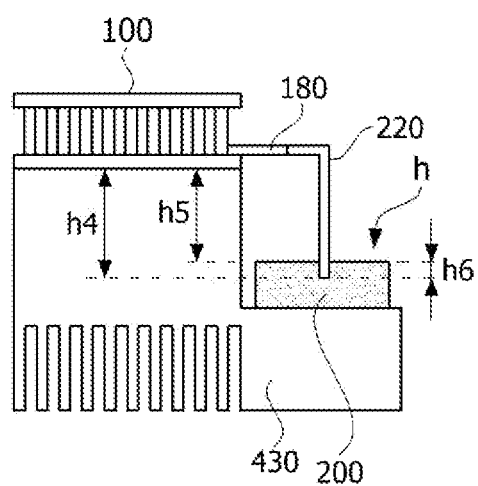

HEAT CONVERSION APPARATUS

CROSS-REFERENCE TO RELATED PATENT APPLICATIONS

This application is a Continuation of U.S. patent application Ser. No. 16/615,516, filed Nov. 21, 2019, which is a U.S. National Stage Application under 35 U.S.C. § 371 of PCT Application No. PCT/KR2018/006480, filed Jun. 7, 2018, which claims priority to Korean Patent Application Nos. 10-2017-0071493, filed Jun. 8, 2017 and 10-2017-0128154, filed Sep. 29, 2017, whose entire disclosures are hereby incorporated by reference.

TECHNICAL FIELD

The present invention relates to a heat conversion apparatus, and more specifically, to a heat conversion apparatus configured to generate electricity using heat of hot air.

BACKGROUND ART

A thermoelectric effect is a phenomenon occurring due to movement of electrons and holes in a material and means direct energy conversion between heat and electricity.

A thermoelectric element is a generic term of elements in which a thermoelectric effect is used and has a structure in which P-type thermoelectric materials and N-type thermoelectric materials disposed between metal electrodes are bonded to form PN junction pairs.

Thermoelectric elements may be divided into elements which use a change in electrical resistance according to a change in temperature, elements which use the Seebeck effect in which an electromotive force is generated due to a difference in temperature, and elements which use the Peltier effect in which heating or heat absorption occurs due to a current.

Thermoelectric elements are being variously applied to home appliances, electronic components, communication components, and the like. For example, the thermoelectric elements may be applied to cooling apparatuses, heating apparatuses, power generation apparatuses, and the like. Therefore, the demand for heat conversion performance of the thermoelectric elements is gradually increasing.

Recently, there is a need to generate electricity by using waste heat generated from engines of automobiles, ships, and the like and thermoelectric elements. In this case, a structure to increase power generation performance is required.

Technical Problem

The present invention is directed to providing a heat conversion apparatus using waste heat.

Technical Solution

One aspect of the present invention provides a heat conversion apparatus including a pipe which includes a first flat surface and a second flat surface disposed to be parallel to the first surface and through which air having a temperature lower than a temperature of introduced air is discharged, a plurality of thermoelectric elements of which heat-absorbing surfaces are disposed outside of each of the first surface and the second surface, a plurality of printed circuit boards (PCB s) electrically connected to the plurality of thermoelectric elements, and a cooling water passing member disposed on heat-radiating surfaces of the plurality of thermoelectric elements, wherein an external floor surface of the cooling water passing member includes a plurality of first external floor surfaces having a first height and a plurality of second external floor surfaces having a second height different from the first height, and the plurality of first external floor surfaces are in contact with the heat-radiating surfaces of the plurality of thermoelectric elements, and the plurality of PCB s are disposed on the plurality of second external floor surfaces.

Each of the PCBs may be connected to at least two thermoelectric elements among the plurality of thermoelectric elements.

The plurality of thermoelectric elements may be arranged in an array type including a plurality of columns and a plurality of rows, and each of the PCBs may be connected to the plurality of thermoelectric elements included in one column or connected to the plurality of thermoelectric elements included in one row.

A heat insulating member may be further disposed between the plurality of thermoelectric elements, and the heat insulating member may be spaced a predetermined distance from the plurality of PCBs.

An air gap may be present between the heat insulating member and the plurality of PCBs.

A radiation fin may be disposed on an internal surface of the pipe

The pipe and the radiation fin may be integrally formed.

The cooling water passing member may include a case, a plurality of inlet pipes which are formed in one wall surface of the case and through which cooling water is introduced, a plurality of outlet pipes which are formed in another wall surface of the case and through which the cooling water is discharged, a plurality of radiation fins formed on an internal floor surface of the case in a direction in which the cooling water flows from the plurality of inlet pipes toward the plurality of outlet pipes, and a cover which covers the case.

Each of the radiation fins may include a first region at a side of each of the plurality of inlet pipes, a second region at a side of each of the plurality of outlet pipes, and a third region between the first region and the second region, wherein heights of the first region and the second region are lower than a height of the third region.

The direction in which the cooling water flows from the plurality of inlet pipes toward the plurality of outlet pipes may be different from a direction in which the air introduced into the pipe is discharged.

The heat conversion apparatus may further include an air inlet pipe which is connected to the pipe and through which air is introduced into the pipe, and an air outlet pipe which is connected to the pipe and through which the air is discharged from the pipe.

A shape of a cross-section of the air inlet pipe and a shape of a cross-section of the air outlet pipe may be different, and the heat conversion apparatus may further include a first connecting pipe which connects the air inlet pipe and the pipe and a second connecting pipe which connects the pipe and the air outlet.

A plurality of grooves for arranging the plurality of thermoelectric elements may be formed outside the pipe.

Another aspect of the present invention provides a heat conversion apparatus including a plurality of thermoelectric elements having heat-absorbing surfaces and heating surfaces, and a substrate electrically connected to the plurality of thermoelectric elements, wherein a pipe from which a fluid having a temperature lower than a temperature of an introduced fluid is discharged is disposed on the heat-absorbing surfaces of the plurality of thermoelectric elements, a cooling water passing member is disposed on the heating surfaces of the plurality of thermoelectric elements, the substrate includes a connecting portion which is disposed between the substrate and the thermoelectric element most adjacent to the substrate and electrically connects the substrate and the thermoelectric element most adjacent to the substrate, and a minimum distance between the substrate and the thermoelectric element is less than a distance between the thermoelectric element and one end of the connecting portion in contact with the substrate.

A maximum distance between the substrate and the thermoelectric element may be greater than a maximum distance between the thermoelectric element and one end of the connecting portion in contact with the substrate.

The plurality of thermoelectric elements may be arranged in an array type including a plurality of columns and a plurality of rows.

The substrate may be connected to the thermoelectric element, which is disposed most adjacent to the substrate, among the plurality of thermoelectric elements disposed on the plurality of columns or connected to the thermoelectric element, which is disposed most adjacent to the substrate, among the plurality of thermoelectric elements disposed on the plurality of rows.

The substrate may be connected to the plurality of thermoelectric elements included one column among the plurality of columns or connected to the plurality of thermoelectric elements included one row among the plurality of rows.

The plurality of thermoelectric elements may be connected to the thermoelectric element, which is adjacent thereto, on one column among the plurality of columns or on one row among the plurality of rows.

The pipe may include a first surface and a second surface opposite to the first surface and further include a radiation fin disposed on an internal surface of the cooling water passing member.

The radiation fin may include a groove, and the substrate may be disposed in the groove.

The groove may be disposed at a side, to which the fluid is discharged from the pipe, of an edge of the radiation fin.

The cooling water passing member may include a case, a plurality of inlet pipes which are formed on one wall surface of the case and through which cooling water is introduced, a plurality of outlet pipes which are formed another wall surface of the case and through which the cooling water is discharged, and a cover which covers the case.

Advantageous Effects

According to the embodiments of the present invention, a heat conversion apparatus having high electricity generation performance can be obtained. Particularly, according to the embodiments of the present invention, uniform performance can be obtained from an entire region of the heat conversion apparatus, and a problem of a printed circuit board (PCB) electrically connected to a thermoelectric element being damaged due to a high temperature of air flowing through a pipe can be prevented.

DESCRIPTION OF DRAWINGS

FIG. 1 is a perspective view illustrating a heat conversion apparatus according to one embodiment of the present invention.

FIG. 2 is an exploded perspective view illustrating the heat conversion apparatus according to one embodiment of the present invention.

FIG. 4 is a perspective view illustrating the thermoelectric element included in the thermoelectric module according to one embodiment of the present invention.

FIG. 5 is a top view illustrating a pipe included in the heat conversion apparatus according to one embodiment of the present invention.

FIG. 6 is a cross-sectional view illustrating the pipe included in the heat conversion apparatus according to one embodiment of the present invention.

FIG. 7 is a top view illustrating a plurality of thermoelectric elements disposed outside of the pipe included in the heat conversion apparatus according to one embodiment of the present invention.

FIG. 8 is a view illustrating an external floor surface of a cooling water passing member included in the heat conversion apparatus according to one embodiment of the present invention.

FIG. 9 is a view illustrating a printed circuit board (PCB) disposed on the external floor surface of the cooling water passing member of FIG. 8.

FIG. 10 is a cross-sectional view illustrating arrangement relationships between the pipe, the thermoelectric element, the PCB, and the cooling water passing member of the heat conversion apparatus according to one embodiment of the present invention.

FIG. 11 is a perspective view illustrating the cooling water passing member according to one embodiment of the present invention.

FIG. 12 is a cross-sectional view illustrating the pipe, the thermoelectric element, and the cooling water passing member according to one embodiment of the present invention.

FIG. 13 is a top view illustrating the thermoelectric elements disposed on the pipe included in the heat conversion apparatus according to one embodiment of the present invention.

FIG. 14 is a view illustrating an external floor surface of a cooling water passing member included in a heat conversion apparatus according to another embodiment of the present invention.

FIG. 15 is a view illustrating a substrate disposed in the external floor surface of the cooling water passing member of FIG. 14.

FIG. 16 is a cross-sectional view illustrating arrangement relationships between a pipe, a thermoelectric element, the substrate, and the cooling water passing member of the heat conversion apparatus according to another embodiment of the present invention.

FIG. 17 is a perspective view illustrating arrangement relationships between the thermoelectric element, a radiation fin, and the substrate according to another embodiment of the present invention.

FIG. 18 is an enlarged view illustrating region D of FIG. 17.

MODES OF THE INVENTION

Figure 3:
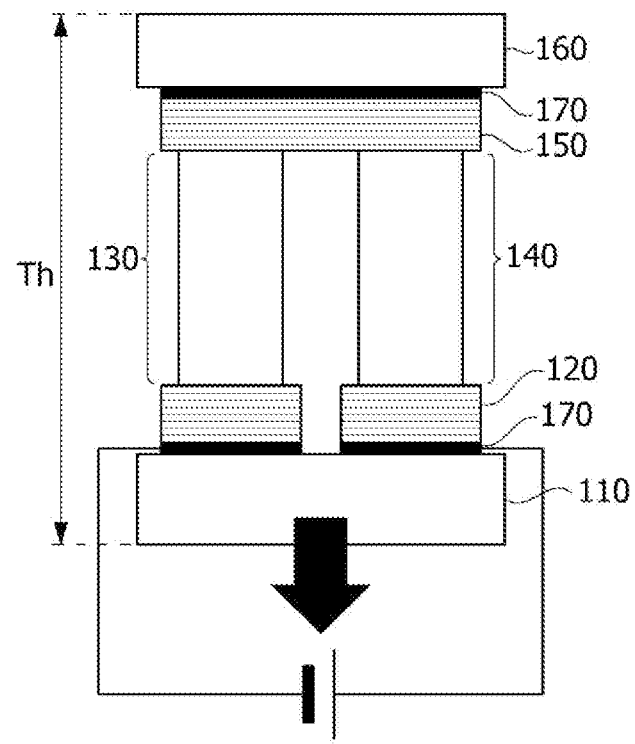
FIG. 3(a) and FIG. 3(b) are cross-sectional views illustrating a thermoelectric element included in a thermoelectric module according to one embodiment of the present invention.
Figure 3:
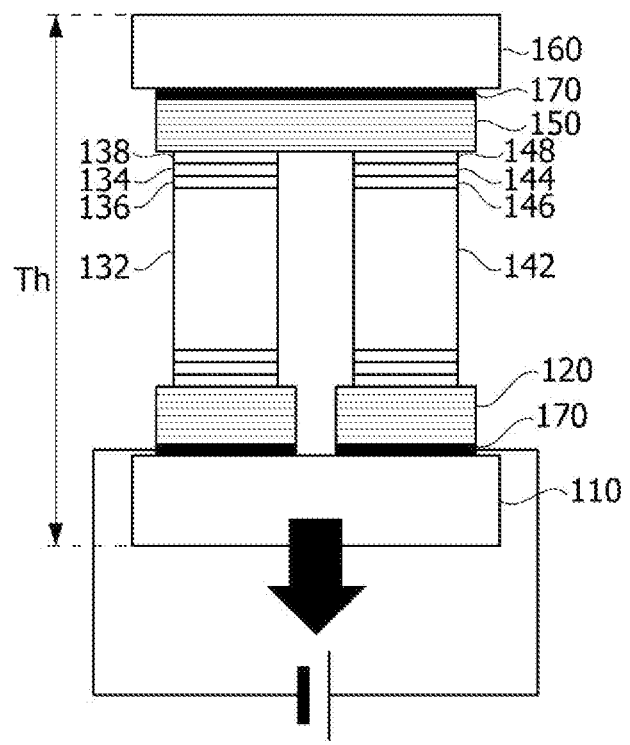

As the invention allows for various changes and numerous embodiments, specific embodiments will be illustrated in the drawings and described in detail in the written description. However, this is not intended to limit the present invention to specific modes of practice, and it is to be appreciated that all changes, equivalents, and substitutes that do not depart from the spirit and technical scope of the present invention are encompassed in the present invention.

It will be understood that, although the terms "first," "second," etc. may be used herein to describe various elements, these elements should not be limited to the terms. The terms are only used to distinguish one element from another. For example, a first element could be termed a second element, and a second element could similarly be termed a first element without departing from the scope of the present invention. As used herein, the term "and/or" includes any one or combinations of the associated listed items.

It will be understood that when an element is referred to as being "connected" or "coupled" to another element, it may be directly connected or coupled to another element or intervening elements may be present. In contrast, when an element is referred to as being "directly connected" or "directly coupled" to another element, there are no intervening elements.

The terminology used herein is for the purpose of describing specific embodiments only and is not intended to be limiting to the invention. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, components, and/or groups thereof but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined here.

Example embodiments of the invention will be described below in more detail with reference to the accompanying drawings. Components that are the same or are corresponding to each other are rendered as the same reference numeral regardless of the figure number, and redundant descriptions thereof will be omitted.

FIG. 1 is a perspective view illustrating a heat conversion apparatus according to one embodiment of the present invention, FIG. 2 is an exploded perspective view illustrating the heat conversion apparatus according to one embodiment of the present invention, FIG. 3 is a cross-sectional view illustrating a thermoelectric element included in a thermoelectric module according to one embodiment of the present invention, and FIG. 4 is a perspective view illustrating the thermoelectric element included in the thermoelectric module according to one embodiment of the present invention.

Referring to FIGS. 1 to 2, a heat conversion apparatus 1000 includes a plurality of thermoelectric elements 100, a plurality of printed circuit boards (PCBs) 200, a pipe 300, and cooling water passing members 400.

A temperature of a fluid (hereinafter, an example of air will be described) discharged from the pipe 300 is lower than a temperature of air introduced into the pipe 300. For example, air introduced into the pipe 300 may be air with waste heat generated by an engine of a vehicle, a ship, or the like but is not limited thereto. For example, a temperature of air introduced into the pipe 300 may be 100 or more, preferably 200 or more, and more preferably range from 220 to 250, but is not limited thereto.

A temperature of cooling water discharged from the cooling water passing member 400 is higher than a temperature of the cooling water introduced into the cooling water passing member 400. For example, a fluid passing through the cooling water passing member 400 may be water, but is not limited thereto, and may be various kinds of fluids having cooling performance. A temperature of cooling water introduced into the cooling water passing member 400 is lower than a temperature of air introduced into the pipe 300. For example, a temperature of cooling water introduced into the pipe 300 may be lower than 100, preferably 50, and more preferably lower than 40, but is not limited thereto.

Heat-absorbing surfaces of the plurality of thermoelectric elements 100 are disposed outside of the pipe 300, and heating surfaces thereof are disposed on the cooling water passing member 400. In addition, the plurality of PCBs electrically connected to the plurality of thermoelectric elements 100 supply power to the plurality of thermoelectric elements 100.

The heat conversion apparatus 1000 according to the embodiment of the present invention may generate power through the thermoelectric elements 100 using a temperature difference between air flowing through the pipe 300 and cooling water flowing through the cooling water passing member 400, that is, a temperature difference between the heat-absorbing surfaces and the heating surfaces of the plurality of thermoelectric elements 100.

In this case, a direction of the air flowing through the pipe 300 may be different from a direction of the cooling water flowing through the cooling water passing member 400. For example, the direction of the air flowing through the pipe 300 and the direction of the cooling water flowing through the cooling water passing member 400 may differ by about 90°. Therefore, a structure in which the cooling water passing member 400 is disposed outside of the pipe 300 is easily designed. In addition, since a temperature of cooling water in a region, into which air is introduced, of the pipe 300 and a region in which air is discharged from the pipe 300 may be uniformly maintained, uniform heat conversion performance can be obtained through an entire region of the pipe 300.

Meanwhile, the heat conversion apparatus 1000 according to the embodiment of the present invention may further include an air inlet pipe 500 through which air is introduced into the pipe 300, and an air outlet pipe 502 which is connected to the pipe 300 and through which air is discharged from the pipe 300.

In a case in which shapes of cross-sections of the air inlet pipe 500 and the air outlet pipe 502 are different from a shape of a cross-section of the pipe 300, the heat conversion apparatus 1000 may also further include a first connecting pipe 600 connecting the air inlet pipe 500 and the pipe 300 and a second connecting pipe 602 connecting the pipe 300 and the air outlet pipe 502. For example, the air inlet pipe 500 and the air outlet pipe 502 may generally have cylindrical forms. However, the pipe 300 may have a quadrilateral or polygonal container form so as to improve heat conversion performance, wherein the heat-absorbing surfaces of the plurality of thermoelectric elements 100 are disposed outside of the pipe 300. Accordingly, the air inlet pipe 500 and one end portion of the pipe 300 may be connected and the air outlet pipe 502 and the other end portion of the pipe 300 may be connected, respectively, through the first connecting pipe 600 and the second connecting pipe 602 each having one end portion formed in a cylindrical form and the other end portion formed in a quadrilateral form.

In this case, the air inlet pipe 500 and the first connecting pipe 600, the first connecting pipe 600 and the pipe 300, the pipe 300 and the second connecting pipe 602, and the second connecting pipe 602 and the air outlet pipe 502 may be connected through coupling members.

In addition, the heat conversion apparatus 1000 according to the embodiment of the present invention may also further include a heat insulating member 700. For example, the heat insulating member 700 may be disposed to cover the cooling water passing member 400 or disposed between the plurality of thermoelectric elements 100 outside the pipe 300.

Meanwhile, referring to FIGS. 3 and 4, the thermoelectric element 100 according to the embodiment of the present invention includes a lower substrate 110, lower electrodes 120, a P-type thermoelectric leg 130, an N-type thermoelectric leg 140, an upper electrode 150, and an upper substrate 160.

The lower electrodes 120 are disposed between the lower substrate 110 and lower floor surfaces of the P-type thermoelectric leg 130 and the N-type thermoelectric leg 140, and the upper electrode 150 is disposed between the upper substrate 160 and upper floor surfaces of the P-type thermoelectric leg 130 and the N-type thermoelectric leg 140. Accordingly, a plurality of P-type thermoelectric legs 130 and a plurality of N-type thermoelectric legs 140 are electrically connected by lower electrodes 120 and upper electrodes 150. The pair of P-type thermoelectric leg 130 and N-type thermoelectric leg 140 which are disposed between the lower electrodes 120 and the upper electrode 150 and electrically connected to each other may form a unit cell.

For example, when a voltage is applied between the lower electrodes 120 and the upper electrode 150 through lead wires 181 and 182, due to the Peltier effect, the substrate through which a current flows from the P-type thermoelectric leg 130 to the N-type thermoelectric leg 140 absorbs heat and thus serves as a cooling part, and the substrate through which a current flows from the N-type thermoelectric leg 140 to the P-type thermoelectric leg 130 is heated and thus serves as a heating part. In the present specification, the heat-absorbing surface may also be one surface of the substrate serving as the cooling part, and the heating surface may also be one surface of the substrate serving as the heating part.

Here, the P-type thermoelectric leg 130 and the N-type thermoelectric leg 140 may be bismuth-telluride (Bi—Te)-based thermoelectric legs mainly including bismuth (Bi) and tellurium (Te). The P-type thermoelectric leg 130 may be a thermoelectric leg including a Bi—Te-based main material containing at least one among antimony (Sb), nickel (Ni), aluminum (Al), copper (Cu), silver (Ag), lead (Pb), boron (B), gallium (Ga), tellurium (Te), bismuth (Bi), and indium (In) in the range of 99 to 99.999 wt % and a mixture containing Bi or Te in the range of 0.001 to 1 wt % based on a total weight of 100 wt %. For example, a main material of the P-type thermoelectric leg 130 may be Bi-selenium (Se)—Te, and the P-type thermoelectric leg 130 may further include Bi or Te in the range of 0.001 to 1 wt % based on a total weight. The N-type thermoelectric leg 140 may be a thermoelectric leg including a Bi—Te-based main material containing at least one among Se, Ni, Cu, Ag, Pb, B, Ga, Te, Bi, and In in the range of 99 to 99.999 wt % and a mixture containing Bi or Te in the range of 0.001 to 1 wt % based on a total weight of 100 wt %. For example, a main material of the N-type thermoelectric leg 140 may be Bi—Sb—Te, and the N-type thermoelectric leg 140 may further include Bi or Te in the range of 0.001 to 1 wt % based on a total weight.

The P-type thermoelectric leg 130 and the N-type thermoelectric leg 140 may be formed in a bulk type or a stacked type. Generally, the bulk type P-type thermoelectric leg 130 or the bulk type N-type thermoelectric leg 140 may be formed by performing a thermal process on a thermoelectric material to manufacture an ingot, grinding and straining the ingot to obtain a powder for a thermoelectric leg, sintering the powder, and cutting a sintered body. The stacked type P-type thermoelectric leg 130 or the stacked type N-type thermoelectric leg 140 may be formed by coating a sheet-shaped base with a paste including a thermoelectric material to form unit members, stacking the unit members, and cutting the stacked unit members.

In this case, the pair of P-type thermoelectric leg 130 and N-type thermoelectric leg 140 may have the same shape and volume or may have different shapes and volumes. For example, since electrical conduction properties of the P-type thermoelectric leg 130 and the N-type thermoelectric leg 140 are different, a height or cross sectional area of the N-type thermoelectric leg 140 may be different from that of the P-type thermoelectric leg 130.

The performance of the thermoelectric element according to one embodiment of the present invention may be expressed as a Seebeck index. The Seebeck index (ZT) may be expressed by Equation 1.

$$ZT = \alpha^2 \sigma T/k \qquad \text{Equation 1}$$

In this case, α is the Seebeck coefficient V/K, σ is electric conductivity S/m, $\alpha^2 \cdot \sigma$ is a power factor W/mK2. In addition, T is temperature, k is thermal conductivity W/mK. K may be expressed as a·cp·ρ, wherein a thermal diffusivity cm2/S, cp is specific heat J/gK, and ρ is density g/cm3.

In order to obtain a Seebeck index of a thermoelectric element, a Z value V/K is measured using a Z meter, and then, the Seebeck index (ZT) may be calculated using the measured Z value.

According to the embodiment of the present invention, the P-type thermoelectric leg 130 and the N-type thermoelectric leg 140 may also have a structure illustrated in FIG. 3B. Referring to FIG. 3B, the thermoelectric legs 130 and 140 include thermoelectric material layers 132 and 142, first plated layers 134 and 144 stacked on one surfaces of the thermoelectric material layers 132 and 142, second plated layers 134 and 144 stacked on the other surfaces opposite to the one surfaces of the thermoelectric material layers 132 and 142, first bonding layers 136 and 146 and second bonding layers 136 and 146 disposed between the thermoelectric material layers 132 and 142 and the first plated layers 134 and 144, and the thermoelectric material layers 132 and 142 and the second plated layers 134 and 144, and first metal layers 138 and 148 and second metal layers 138 and 148 stacked on the first plated layers 134 and 144 and the second plated layers 134 and 144.

In this case, the thermoelectric material layers 132 and 142 may include Bi and Te which are semiconductor materials. The thermoelectric material layers 132 and 142 may have the same materials or forms as the P-type thermoelectric leg 130 and the N-type thermoelectric leg 140 described with reference to FIG. 3A.

In addition, the first metal layers 138 and 148 and the second metal layers 138 and 148 may include Cu, a Cu alloy, Al, or an Al alloy and may have thicknesses in the range of 0.1 to 0.5 mm or preferably have thicknesses in the range of 0.2 to 0.3 mm. Since thermal expansion coefficients of the first metal layers 138 and 148 and the second metal layers 138 and 148 are similar to or greater than thermal expansion coefficients of the thermoelectric material layers 132 and 142, compression stresses are applied to interfaces between the first metal layers 138 and 148 and the thermoelectric material layers 132 and 142 and between the second metal layers 138 and 148 and the thermoelectric material layers 132 and 142 when sintering, and thus cracking or delamination can be prevented. In addition, since bonding forces between the first metal layers 138 and 148 and the electrodes 120 and 150 and between the second metal layers 138 and 148 and the electrodes 120 and 150 are high, the thermoelectric legs 130 and 140 can be stably coupled to the electrodes 120 and 150, respectively.

Next, each of the first plated layers 134 and 144 and the second plated layers 134 and 144 may include at least one among Ni, Sn, Ti, Fe, Sb, Cr, and Mo and have a thickness in the range of 1 to 20 μm and preferably have a thickness in the range of 1 to 10 μm. Since the first plated layers 134 and 144 and the second plated layers 134 and 144 prevent reactions between Bi or Te, which is a semiconductor material, in the thermoelectric material layers 132 and 142 and the first metal layers 138 and 148 and the second metal layers 138 and 148, performance degradation of the thermoelectric element can be prevented, and oxidation of the first metal layers 138 and 148 and the second metal layers 138 and 148 can be prevented.

In this case, the first bonding layers 136 and 146 and the second bonding layers 136 and 146 may be disposed between the thermoelectric material layers 132 and 142 and the first plated layers 134 and 144 and between the thermoelectric material layers 132 and 142 and the second plated layers 134 and 144. In this case, each of the first bonding layers 136 and 146 and the second bonding layers 136 and 146 may include Te. For example, each of the first bonding layers 136 and 146 and the second bonding layers 136 and 146 may include at least one among Ni—Te, Sn—Te, Ti—Te, Fe—Te, Sb—Te, Cr—Te, and Mo—Te. According to the embodiment of the present invention, a thickness of each of the first bonding layers 136 and 146 and the second bonding layers 136 and 146 may range from 0.5 to 100 μm and may preferably range from 1 to 50 μm. According to the embodiment of the present invention, the first bonding layers 136 and 146 and the second bonding layers 136 and 146 each including Te may be disposed between the thermoelectric material layers 132 and 142 and the first plated layers 134 and 144 and between the thermoelectric material layers 132 and 142 and the second plated layers 134 and 144 in advance to prevent Te in the thermoelectric material layers 132 and 142 from being diffused into the first plated layers 134 and 144 and the second plated layers 134 and 144. Accordingly, the generation of the Bi-rich region can be prevented.

Meanwhile, each of the lower electrodes 120 disposed between the lower substrate 110 and the P-type thermoelectric leg 130 and between the lower substrate 110 and the N-type thermoelectric leg 140, and the upper electrode 150 disposed between the upper substrate 160 and the P-type thermoelectric leg 130 and between the upper substrate 160 and the N-type thermoelectric leg 140 may include at least one among Cu, Ag, and Ni and may have a thickness in the range of 0.01 mm to 0.3 mm. In a case in which a thickness of the lower electrode 120 or the upper electrode 150 is less than 0.01 mm, an electrode function thereof is degraded so that electric conductivity performance thereof may be lowered, and in a case in which the thickness thereof is greater than 0.3 mm, resistance thereof increases so that conduction efficiency thereof may be lowered.

In addition, the lower substrate 110 and the upper substrate 160 which face each other may be insulating substrates or metal substrates. The insulating substrate may be an alumina substrate or flexible polymer resin substrate. The flexible polymer resin substrate may include any insulating resin material such as high permeability plastics including polyimide (PI), polystyrene (PS), poly methyl methacrylate (PMMA), a cyclic olefin copolymer (COC), polyethylene terephthalate (PET), or a resin. The metal substrate may include Cu, a Cu alloy, or a Cu—Al alloy, and a thickness thereof may be in the range of 0.1 mm to 0.5 mm. In a case in which the thickness of the metal substrate is less than 0.1 mm or greater than 0.5 mm, since a heat dissipation property or thermal conductivity thereof may become excessively high, the reliability of the thermoelectric element may be lowered. In addition, in a case in which the lower substrate 110 and the upper substrate 160 are the metal substrates, dielectric layers 170 may be further formed between the lower substrate 110 and the lower electrodes 120 and between the upper substrate 160 and the upper electrode 150. The dielectric layer 170 may include a material having a thermal conductivity in the range of 5 to 10 W/K and may have a thickness in the range of 0.01 mm to 0.15 mm. In a case in which the thickness of the dielectric layer 170 is less than 0.01 mm, insulating efficiency or a withstanding voltage property may be lowered, and in a case in which the thickness thereof is greater than 0.15 mm, thermal conductivity is lowered so that heat dissipation efficiency may be lowered.

Here, sizes of the lower substrate 110 and the upper substrate 160 may also be different. For example, a volume, a thickness, or an area of one of the lower substrate 110 and the upper substrate 160 may be greater than that of the other. Accordingly, the heat absorption or dissipation performance of the thermoelectric element can be enhanced.

In addition, a heat dissipation pattern, for example, an irregular pattern, may also be formed on at least one surface of the lower substrate 110 and the upper substrate 160. Accordingly, the heat dissipation performance of the thermoelectric element can be enhanced. In a case in which the irregular pattern is formed on a surface in contact with the P-type thermoelectric leg 130 or N-type thermoelectric leg 140, a bonding property between the thermoelectric leg and the substrate can also be improved.

Meanwhile, the P-type thermoelectric leg 130 or N-type thermoelectric leg 140 may have a cylindrical form, a polygonal column form, an elliptical column form, or the like.

According to one embodiment of the present invention, a width of a portion, which is bonded to the electrode, of the P-type thermoelectric leg 130 or N-type thermoelectric leg 140 may be large.

Hereinafter, the pipe, the thermoelectric element, the PCB, and the cooling water passing member included in the heat conversion apparatus according to the embodiment of the present invention will be described in more detail.

FIG. 5 is a top view illustrating the pipe included in the heat conversion apparatus according to one embodiment of the present invention, FIG. 6 is a cross-sectional view illustrating the pipe included in the heat conversion apparatus according to one embodiment of the present invention, FIG. 7 is a top view illustrating a plurality of thermoelectric elements disposed outside of the pipe included in the heat conversion apparatus according to one embodiment of the present invention, FIG. 8 is a view illustrating an external floor surface of the cooling water passing member included in the heat conversion apparatus according to one embodiment of the present invention, FIG. 9 is a view illustrating the PCB disposed on the external floor surface of the cooling water passing member of FIG. 8, FIG. 10 is a cross-sectional view illustrating arrangement relationships between the pipe, the thermoelectric element, the PCB, and the cooling water passing member of the heat conversion apparatus according to one embodiment of the present invention, FIG. 11 is a perspective view illustrating the cooling water passing member according to one embodiment of the present invention, and FIG. 12 is a cross-sectional view illustrating the pipe, the thermoelectric element, and the cooling water passing member according to one embodiment of the present invention.

Referring to FIGS. 5 to 7, the pipe 300 includes a first flat surface 310 and a second flat surface 320 opposite to the first surface, and grooves 312 on which the thermoelectric elements 100 are seated are provided outside the first surface 310 and the second surface 320. In addition, the heat-absorbing surface of one thermoelectric element 100 is disposed on each of the grooves 312. In this case, as illustrated in FIG. 4, the thermoelectric elements 100 may include a plurality of P-type thermoelectric legs and a plurality of N-type thermoelectric legs which are alternately disposed in series. In this case, the plurality of thermoelectric elements 100 may be arranged in an array type including a plurality of columns and a plurality of rows. In this case, the plurality of thermoelectric elements 100 are illustrated in a 3*4 array but are not limited thereto and may be arrayed to have various sizes according to a desired output. Although not illustrated in the drawings, the plurality of thermoelectric elements 100 may be attached to the first surface 310 and the second surface 320 of the pipe 300 using thermal grease.

As described above, when the pipe 300 includes the first flat surface 310 and the second flat surface 320 disposed to be parallel to the first surface 310, the thermoelectric elements 100 may be easily disposed when compared to a pipe having surfaces having curvatures, and heat-absorbing performance may be improved due to contact between the external surface of the pipe 300 and the entire heat-absorbing surfaces of the thermoelectric elements 100.

Meanwhile, the heat insulating member 700 may also be further disposed in a region excluding a region in which the thermoelectric elements 100 are disposed on the first surface 310 and the second surface 320, that is, a region between the plurality of thermoelectric elements 100. Accordingly, even when heat is generated from the external surface of the pipe 300 due to hot air passing through the pipe 300, the heat may not affect the cooling water passing member 400 or the PCB 200 disposed adjacent to the first surface 310 and the second surface 320 of the pipe 300.

Referring back to FIG. 6, radiation fins 330 may be further disposed on internal surfaces of the pipe 300. The radiation fins 330 may be integrally formed with the pipe 300, and the pipe 300 and the radiation fins 330 disposed thereon may also serve as one heat sink. As described above, when the radiation fins 330 are disposed on the internal surfaces of the pipe 300, heat of hot air passing through the pipe 300 can be more effectively transmitted to the heat-absorbing surfaces of the thermoelectric elements 100.

Meanwhile, a shape of a cross-section of the pipe 300 is illustrated as a quadrilateral shape in FIG. 6 but is not limited thereto. When the first surface 310 and the second surface 320 opposite to the first surface 310 are parallel, a surface connecting the first surface 310 and the second surface 320 may be a surface having a curvature.

Referring to FIGS. 8 to 10, a part of the external floor surface of the cooling water passing member 400 is in contact with the heating surfaces of the plurality of thermoelectric elements 100, and the plurality of PCBs 200 may be disposed on the other part of the external floor surface of the cooling water passing member 400. In this case, the PCBs 200 may be coupled to the external floor surface of the cooling water passing member 400 using screws 202. In addition, each of the PCBs 200 may be connected to the plurality of thermoelectric elements 100 included in one column among the plurality of thermoelectric elements 100 arranged in the array type or connected to the plurality of thermoelectric elements 100 included in one row. In this case, each of the PCBs 200 may be connected to the plurality of thermoelectric elements 100 using connectors or a soldering method.

Meanwhile, the external floor surface of the cooling water passing member 400 may include a plurality of first external floor surfaces 402 having a first height and a plurality of second external floor surfaces 404 having a second height different from the first height and disposed between the plurality of first external floor surfaces 402. In addition, the first external floor surfaces 402 are in contact with the heating surfaces of the plurality of thermoelectric elements 100, the plurality of PCBs 200 are disposed on the second external floor surfaces 404, and the second height may be higher than the first height based on the heating surface of the plurality of thermoelectric elements 100. For example, the plurality of second external floor surfaces 404 may have groove forms formed between the plurality of first external floor surfaces 402. Accordingly, each of the PCBs 200 may be disposed to be spaced a predetermined distance from the heat insulating member 700 disposed between the plurality of thermoelectric elements 100, and air gaps may be present between the heat insulating member 700 and the PCBs 200. Therefore, influence on the PCBs 200 occurring due to heat radiated from the external surface of the pipe 300 by hot air flowing through the pipe 300 can be minimized.

Referring to FIGS. 11 and 12, the cooling water passing member 400 according to the embodiment of the present invention includes a case 406 provided with floor and wall surfaces, a plurality of inlet pipes 410 which are formed in one wall surface of the case 406 and into which cooling water is introduced, a plurality of outlet pipes 420 which are formed in another wall surface of the case 406 and from which the cooling water is discharged, a plurality of radiation fins 430 formed on the internal floor surface of the case 406 in a direction in which the cooling water flows from the plurality of inlet pipes 410 toward the plurality of outlet pipes 420, and a cover 450 which covers the case 406. Grooves 440 to be coupled to the cover 450 may also be further formed in the case 406.

In this case, the number of the plurality of inlet pipes 410 is the same as the number of the plurality of outlet pipes 420, the plurality of inlet pipes 410 may be disposed at positions corresponding to the plurality of outlet pipes 420, and the direction from the inlet pipes 410 toward the outlet pipes 420 may intersect a direction in which hot air flows through the pipe 300.

Meanwhile, the radiation fins 430 formed on the internal floor surface of the case 406 of the cooling water passing member 400 may include first regions 432 at sides of the plurality of inlet pipes 410, second regions 434 at sides of the plurality of outlet pipes 420, and third regions 436 between the first regions 432 and the second regions 434. In this case, heights of the first region 432 and the second region 434 may be lower than a height of the third region 436. As described above, in a case in which the heights of the radiation fins around the inlet pipes into which cooling water is introduced and the outlet pipes from which the cooling water is discharged are low, since a flow path is not hindered, the cooling water can flow smoothly.

Meanwhile, according to the embodiment of the present invention, a temperature of air introduced into the pipe 300 may be different from a temperature of the air passing through and discharged from the pipe 300. That is, the temperature of the air passing through and discharged from the pipe 300 may be lower than the temperature of the air introduced into the pipe 300. However, heat conversion performance of the thermoelectric element included in the heat conversion apparatus according to the embodiment of the present invention may be higher when a temperature difference between the heat-absorbing surface and the heating surface is higher. Accordingly, heat conversion performance around an outlet port of the pipe 300 may be lower than heat conversion performance around an inlet port thereof. In the embodiment of the present invention, in order to solve such a problem, a width or area of the inlet port of the pipe 300 may be different from a width or area of the outlet port thereof, or sizes, arrangement types, the number, and the like of the thermoelectric elements may be changed according to positions thereof to compensate for degradation of heat conversion performance due to a temperature difference.

FIG. 13 is a top view illustrating the thermoelectric elements disposed on the pipe included in the heat conversion apparatus according to one embodiment of the present invention.

Referring to FIG. 13, widths of the first surface 310 and the second surface 320 of the pipe 300 increase from the inlet port of air toward the outlet port, and accordingly, the number of the disposed thermoelectric elements also increases. Accordingly, degradation of heat conversion performance around the outlet port can be compensated for.

In addition, in a case in which the cooling water passing member 400 includes the plurality of inlet pipes, cooling water having a lower temperature may be introduced there into when the inlet pipe is closer to the outlet port of the pipe 300. Accordingly, since a temperature difference between the heat-absorbing surface and the heating surface of the thermoelectric element disposed around the inlet port of the pipe 300 may be maintained to be similar to a temperature difference between the heat-absorbing surface and the heating surface of the thermoelectric element disposed around the outlet port of the pipe 300, degradation of heat conversion performance around the outlet port can be compensated for.

Meanwhile, the cooling water passing member and the substrate may also be disposed according to another embodiment.

FIG. 14 is a view illustrating an external floor surface of a cooling water passing member included in a heat conversion apparatus according to another embodiment of the present invention, FIG. 15 is a view illustrating a substrate disposed in the external floor surface of the cooling water passing member of FIG. 14, and FIG. 16 is a cross-sectional view illustrating arrangement relationships between a pipe, a thermoelectric element, the substrate, and the cooling water passing member of the heat conversion apparatus according to another embodiment of the present invention.

Referring to FIGS. 14 to 16, a part of an external floor surface of a cooling water passing member 400 may be in contact with heating surfaces of a plurality of thermoelectric elements 100. In addition, a substrate 200 may be disposed on the other part of the external floor surface of the cooling water passing member 400. In this case, the substrate 200 may be provided with a plurality of substrates 200, and the substrates 200 may be coupled to the external floor surface of the cooling water passing member 400 using screws 202. In this case, the substrate 200 may be used with a PCB.

The substrate 200 may be connected to the plurality of thermoelectric elements 100 included in one column among the plurality of thermoelectric elements 100. In addition, the substrate 200 may also be connected to the plurality of thermoelectric elements 100 included in one row there among. In addition, the substrate 200 may be positioned at an edge of the external floor surface of the cooling water passing member 400. For example, the substrate 200 may be directly connected to the thermoelectric element positioned most adjacent to the substrate 200 among the plurality of thermoelectric elements 100 disposed on one column. In addition, the thermoelectric element 100 most adjacent to the substrate 200 may be electrically connected to another thermoelectric element of the same column. According to this configuration, since the substrate 200 is directly connected to the thermoelectric element 100 disposed most adjacent thereto among the thermoelectric elements disposed on the predetermined column, the substrate 200 may also be electrically connected to the thermoelectric element in addition to the thermoelectric element disposed on the predetermined column.

Meanwhile, the external floor surface of the cooling water passing member 400 includes a plurality of first external floor surfaces 402 having a first height and a plurality of first external floor surfaces 402 having a second height different from the first height and disposed between the plurality of second external floor surfaces 406. In addition, the first external floor surfaces 402 are in contact with the heating surfaces of the plurality of thermoelectric elements 100, the plurality of substrates 200 are disposed on the second external floor surfaces 406, and the second height may be higher than the first height based on the heating surfaces of the plurality of thermoelectric elements 100. For example, the plurality of second external floor surfaces 406 may have groove forms formed between the plurality of first external floor surfaces 402. Accordingly, the substrates 200 may be disposed to be spaced a predetermined distance d from a heat insulating member 700 disposed between the plurality of thermoelectric elements 100, and air gaps may present between the heat insulating member 700 and the substrates 200. Therefore, influence on the substrate 200 occurring due to heat radiated from the external surface of the pipe 300 due to hot air flowing through the pipe 300 can be minimized.

FIG. 17 is a perspective view illustrating arrangement relationships between the thermoelectric element, a radiation fin, and the substrate according to another embodiment of the present invention, and FIG. 18 is an enlarged view illustrating region D of FIG. 17.

Referring to FIGS. 17 and 18, as described above, the plurality of thermoelectric elements 100 may be disposed in an array type including columns and rows. In addition, a radiation fin 430 may be disposed under the thermoelectric elements 100. In addition, the radiation fins 430 may be disposed along one of the column and row of the thermoelectric elements 100. For example, the radiation fin 430 may be disposed along the column of the thermoelectric element 100. In addition, a pattern of the radiation fin 430 may be formed in a direction which is the same as the direction in which cooling water flows through the cooling water passing member. Specifically, the radiation fin 430 may include the pattern, and the pattern formed on the radiation fin 430 may be formed to not hinder a flow of cooling water. For example, the radiation fin 430 may have a plurality of through holes. In addition, a direction in which the plurality of through holes pass through the radiation fin 430 may be the same as the direction in which cooling water flows. According to such a configuration, the radiation fin 430 may improve heat exchange efficiency between the cooling water and the thermoelectric element.

As described above, the pattern of the radiation fin 430 may be formed in the direction which is the same as the direction in which the cooling water flows. In addition, the pattern of the radiation fin 430 may be matched with the column or row of the plurality of thermoelectric elements 100. According to such a configuration, the radiation fin 430 may include through holes (for example, patterns) formed in a direction which is the same as the direction of the column of the plurality of thermoelectric elements 100 or include through holes formed in a direction which is the same as the direction of the row of the plurality of thermoelectric elements 100.

In addition, the radiation fin 430 may be provided with a plurality of radiation fins 430 which each are disposed on one of the columns or rows of the plurality of thermoelectric elements 100. However, the present invention is not limited thereto, and the radiation fins 430 may be integrally formed.

The radiation fin 430 may include a recess h which is a groove. The recess h may be provided at one side of the radiation fin 430. For example, the recess h may be disposed in an edge of the radiation fin 430. In addition, the recess h may be disposed in the edge of the radiation fin 430 in a direction which is the same as the direction of the column or row of the plurality of thermoelectric elements 100.

In addition, the substrate 200 may be disposed in the recess h. The recess h may be disposed in the edge of the radiation fin 430. Accordingly, the substrate 200 may be disposed in the edge of the radiation fin 430. For example, the substrate 200 may be disposed at a side of an outlet pipe through which a fluid is discharged through a pipe on the edge of the radiation fin 430. According to such an arrangement, the substrate 200 does not hinder heat exchange between cooling water and a heat sink, and thus a cooling action of the cooling water is not hindered. In addition, since the substrate 200 is affected by the fluid passing through the pipe, heat is transmitted to the substrate 200 from the fluid of which a temperature is decreased instead of the fluid having a high temperature, and thus durability degradation of the substrate 200 can be prevented. In addition, a performance change of the substrate 200 due to high temperature can be prevented.

In addition, the substrate 200 may include connecting grooves 210 and connecting portions 220 connected to the thermoelectric elements 100. The connecting grooves 210 and the connecting portions 220 are positioned on the substrate 200, and conductive materials may be disposed on the connecting grooves 210 and the connecting portions 220 to be electrically connected to lead wires 181 and 182 of the thermoelectric elements 100. The connecting grooves 210 and the connecting portions 220 may be integrally formed.

In addition, the connecting portion 220 may be disposed between the thermoelectric element 100 disposed on the column or row most adjacent to the substrate 200 and the substrate 200 and may electrically connect the substrate 200 to the thermoelectric element 100 disposed on the column or row most adjacent to the substrate 200.

In addition, when the substrate 200 is electrically connected to the thermoelectric element 100 most adjacent to the substrate 200, since the thermoelectric element 100 most adjacent to the substrate 200 is connected to another thermoelectric element 100 disposed on the same column or row, another thermoelectric element 100 may also receive electricity from the substrate 200 as a result. According to such a configuration, all the plurality of thermoelectric elements 100 can be operated only by electrically connecting the thermoelectric element 100 most adjacent to the substrate 200 to the substrate 200. Such an operation may be performed by electrically connecting the plurality of thermoelectric elements 100 disposed on the same row or column. Therefore, the plurality of thermoelectric elements 100 may not be individually connected to the substrate 200 using wires or connectors. Accordingly, the heat conversion apparatus according to the embodiment may prevent a problem in that the electrical connection is disconnected due to physical and thermal impacts applied to the thermoelectric elements 100. Accordingly, the heat conversion apparatus according to the embodiment may be free from the physical and thermal impacts. In addition, since the heat conversion apparatus according to the embodiment does not need the substrate 200 to be individually connected to the plurality of thermoelectric elements 100, a failure rate due to disconnection can also be reduced.

In addition, a minimum distance h5 between the substrate 200 and the thermoelectric element 100 most adjacent to the substrate 200 may be less than a distance h4 between one end of the connecting portion 220 in contact with the substrate 200 and the thermoelectric element 100. In addition, the minimum distance between the substrate 200 and the thermoelectric element 100 most adjacent to the substrate 200 may be a minimum distance between an upper surface of the substrate 200 and a lower surface of the substrate of the thermoelectric element 100 based on a cross-section as illustrated in FIG. 18. In addition, in this case, the distance between the one end of the connecting portion 220 in contact with the substrate 200 and the thermoelectric element 100 includes the minimum distance h4 between one end of the connecting portion 220 in contact with the substrate 200 and the thermoelectric element 100.

In addition, for example, since the minimum distance h5 between the substrate 200 and the thermoelectric element 100 most adjacent to the substrate 200 is less than the minimum distance h4 between the one end of the connecting portion 220 in contact with the substrate 200 and the thermoelectric element 100, the connecting portion 220 may be electrically connected to the substrate. According to such a configuration, electrical connection between the substrate 200 and the thermoelectric element 100 can be reinforced using the lead wires 181 and 182 of the thermoelectric element 100.

In addition, since the substrate 200 is disposed in the recess h as described above, the substrate 200 may be spaced a distance from the thermoelectric element 100. Accordingly, since the substrate 200 receives heat transmitted only from the thermoelectric element 100 through the radiation fin 430 and does not directly receive heat from the thermoelectric element 100 which is not in contact with the substrate 200, degradation of heat transmission efficiency due to the radiation fin 430 can be prevented. In addition, since the substrate 200 is disposed in the recess h and is disposed to be spaced apart from the thermoelectric element 100, the substrate 200 can be less affected by external impacts.

In addition, a maximum distance between the substrate 200 and the thermoelectric element 100 may be greater than a maximum distance between one end of the connecting portion 220 in contact with the substrate 200 and the thermoelectric element. The maximum distance between the substrate 200 and the thermoelectric element 100 may include a maximum distance between a predetermined point of a lower surface of the substrate 200 and the thermoelectric element 100 most adjacent to the predetermined point of the lower surface of the substrate 200. In addition, the maximum distance between one end of the connecting portion 220 in contact with the substrate 200 and the thermoelectric element 100 may include the maximum distance between the predetermined point of the lower surface of the substrate 200 and the thermoelectric element 100 most adjacent to the predetermined point. That is, since one end portion of the connecting portion 220 is not in contact with the radiation fin 430 and is disposed in the substrate 200, the connecting portion 220 may be electrically connected to the substrate 200. Accordingly, since electrical connection points present in the substrate 200 may be variously disposed, design of a circuit pattern and the like in the substrate 200 may be free. In addition, according to such a configuration, a coupling force due to the electrical connection between the connecting portion 220 and the substrate 200 can be improved.

While the invention has been shown and described with reference to the exemplary embodiments thereof, it will be understood by those skilled in the art that various changes in form and details may be made therein without departing from the spirit and scope of the invention as defined by the appended claims

The invention claimed is:

1. A heat conversion apparatus comprising:
   a pipe which includes a first flat surface and a second flat surface disposed to be parallel to the first flat surface and through which air having a temperature lower than a temperature of introduced air is discharged, the pipe including an inlet of the pipe and an outlet of the pipe;
   a plurality of thermoelectric elements of which heat-absorbing surfaces are disposed outside of each of the first flat surface and the second flat surface; and
   a cooling water passing member disposed on heat-radiating surfaces of the plurality of thermoelectric elements,
   wherein a width of the first flat surface having a certain distance from the outlet of the pipe is greater than a width of the first flat surface having the certain distance from the inlet of the pipe, and a width of the second flat surface having the certain distance from the outlet of the pipe is greater than a width of the second flat surface having the certain distance from the inlet of the pipe,
   wherein at least one of a number and an area of the plurality of thermoelectric elements disposed within the certain distance from the outlet of the pipe is greater than at least one of a number and an area of the plurality of thermoelectric elements disposed within the certain distance from the inlet of the pipe,
   wherein a cross-sectional area of the outlet of the pipe is greater than a cross-sectional area of the inlet of the pipe,
   wherein a heat insulating member is disposed between the plurality of thermoelectric elements on the first flat surface; and
   wherein the heat insulating member is spaced a predetermined distance from at least one printed circuit board (PCB) electrically connected to the plurality of thermoelectric elements on the first flat surface.

2. The heat conversion apparatus of claim 1, wherein:
   the cooling water passing member includes a plurality of inlet pipes through which cooling water is introduced; and
   a plurality of outlet pipes through which the cooling water is discharged,
   a direction in which the cooling water flows from the plurality of inlet pipes toward the plurality of outlet pipes is different from a direction in which air introduced into the pipe is discharged.

3. The heat conversion apparatus of claim 2, wherein a temperature of the cooling water flowing into an inlet pipe closest to the outlet of the pipe among the plurality of inlet pipes differs from a temperature of the cooling water flowing into an inlet pipe closest to the inlet of the pipe among the plurality of inlet pipes.

4. The heat conversion apparatus of claim 3, wherein the temperature of the cooling water flowing into the inlet pipe closest to the outlet of the pipe among the plurality of inlet pipes is greater than the temperature of the cooling water flowing into the inlet pipe closest to the inlet of the pipe among the plurality of inlet pipes.

5. The heat conversion apparatus of claim 1,
   wherein an external floor surface of the cooling water passing member includes at least one first external floor surface having a first height and at least one second external floor surface having a second height different from the first height, and
   the at least one first external floor surface is in contact with the heat-radiating surfaces of the plurality of thermoelectric elements, and the at least one PCB is disposed on the at least one second external floor surface.

6. The heat conversion apparatus of claim 5, wherein each of the at least one PCB is connected to at least two thermoelectric elements among the plurality of thermoelectric elements.

7. The heat conversion apparatus of claim 1, wherein an air gap is present between the heat insulating member and the at least one PCB.

8. The heat conversion apparatus of claim 1, wherein a radiation fin is disposed on an internal surface of the pipe.

9. The heat conversion apparatus of claim 8, wherein the pipe and the radiation fin are integrally formed.

10. The heat conversion apparatus of claim 1, further comprising an air inlet pipe which is connected to the pipe and through which air is introduced into the pipe, and an air outlet pipe which is connected to the pipe and through which the air is discharged from the pipe.

11. The heat conversion apparatus of claim 10, wherein a shape of a cross-section of the air inlet pipe and a shape of a cross-section of the air outlet pipe are different, and the heat conversion apparatus further comprises a first connecting pipe which connects the air inlet pipe and the pipe and a second connecting pipe which connects the pipe and an air outlet.

12. The heat conversion apparatus of claim 1, wherein a plurality of grooves for arranging the plurality of thermoelectric elements are formed outside the pipe.

13. The heat conversion apparatus of claim 5, wherein the at least one PCB further includes a connecting portion which is disposed between the at least one PCB and the thermoelectric element most adjacent to the at least one PCB and electrically connects the at least one PCB and the thermoelectric element most adjacent to the at least one PCB, and wherein a minimum distance between the at least one PCB and the thermoelectric element is less than a distance between the thermoelectric element and one end of the connecting portion in contact with the at least one PCB.

14. The heat conversion apparatus of claim 13, wherein a maximum distance between the at least one PCB and the thermoelectric element is greater than a maximum distance between the thermoelectric element and one end of the connecting portion in contact with the at least one PCB.

15. A heat conversion apparatus comprising:
  a pipe which includes a first flat surface and a second flat surface disposed to be parallel to the first flat surface and through which air having a temperature lower than a temperature of introduced air is discharged, the pipe including an inlet of the pipe and an outlet of the pipe;
  a plurality of thermoelectric elements of which heat-absorbing surfaces are disposed outside of each of the first flat surface and the second flat surface; and
  a cooling water passing member disposed on heat-radiating surfaces of the plurality of thermoelectric elements,
  wherein at least one of a number and an area of the plurality of thermoelectric elements disposed within a certain distance from the outlet of the pipe is greater than at least one of a number and an area of the plurality of thermoelectric elements disposed within the certain distance from the inlet of the pipe,
  wherein:
  a heat insulating member is further disposed between the plurality of thermoelectric elements on the first flat surface; and
  the heat insulating member is spaced a predetermined distance from at least one printed circuit board (PCB) electrically connected to the plurality of thermoelectric elements on the first flat surface,
  wherein an air gap is present between the heat insulating member and the at least one PCB.

* * * * *